(12) United States Patent
Yu

(10) Patent No.: US 6,893,940 B2
(45) Date of Patent: May 17, 2005

(54) METHOD OF MANUFACTURING SEMICONDUCTOR DEVICE

(75) Inventor: Ji Hwan Yu, Kwangju (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/734,635

(22) Filed: Dec. 15, 2003

(65) Prior Publication Data

US 2004/0127061 A1 Jul. 1, 2004

(30) Foreign Application Priority Data

Dec. 28, 2002 (KR) .................... 10-2002-0085877

(51) Int. Cl.[7] .................................................. H01L 21/76
(52) U.S. Cl. ....................................... 438/429; 438/424
(58) Field of Search ........................ 438/416, 424–429, 438/436, 438, 439

(56) References Cited

U.S. PATENT DOCUMENTS 6,436,791 B1 * 8/2002 Lin et al. ................... 438/424

FOREIGN PATENT DOCUMENTS

| KR | 2001002746 A | * | 1/2001 |
| KR | 2001009810 A | * | 2/2001 |
| KR | 2002014538 | * | 2/2002 |

* cited by examiner

*Primary Examiner*—Evan Pert
*Assistant Examiner*—Asok Kumar Sarkar
(74) *Attorney, Agent, or Firm*—Pillsbury Winthrop Shaw Pittman LLP

(57) ABSTRACT

A manufacturing method of a semiconductor device is disclosed whereby an oxide layer and a nitride layer are successively formed on a semiconductor substrate. An opening is then formed in the oxide and nitride layers on a field region of the semiconductor substrate. A trench is formed by etching the field region of the semiconductor substrate. The oxide layer and the nitride layer are then removed. A silicon epitaxial layer is grown on the semiconductor substrate including the trench, and finally an oxide layer is deposited in the trench. The silicon epitaxial layer has an increased thickness at the sidewall relative to the bottom face, such that the trench having a finer width is formed.

11 Claims, 7 Drawing Sheets

$t_1 > t_2 > t_3 > t_4$

METHOD OF MANUFACTURING SEMICONDUCTOR DEVICE

CROSS-REFERENCE TO RELATED APPLICATIONS

This application relates to and claims priority to the Republic of Korea Patent Application No. 10-2002-0085877, filed on Dec. 28, 2002, the contents of which are incorporated herein by reference.

BACKGROUND OF THE INVENTION

1. Field of the Invention

The present invention relates to a method for manufacturing a semiconductor device, and more particularly to a method for manufacturing a semiconductor device, in which a trench with a fine line width is easily formed.

2. Description of Related Art

Generally, Local Oxidation Of Silicon ("LOCOS") using a nitride layer is used as an isolation technique in the formation of semiconductor devices. In order to complete the LOCOS process, new isolation technologies have been developed including Poly Buffer LOCOS, and Recessed LOCOS ("R-LOCOS"). These technologies have numerous drawbacks. These processes are complicated. Furthermore, these processes do not eliminate the bird's beak phenomenon, which makes inroads into the active region of the silicon oxide layer, which limits high-integration of the semiconductor device. Additionally, these processes create a step between the surface of an active region of the silicon substrate and the surface of the oxide layer of the field region. As such, a planarizing process needs to be performed to reduce the step between these two surfaces.

A Shallow Trench Isolation ("STI") process was developed. The STI process has several advantages over conventional isolation technology. It has improved isolation properties. It is also very suitable in high-integration of semiconductor devices because of the small spatial requirements.

The STI process includes forming a trench on a field region of a semiconductor substrate. The trench is filled with an oxide layer using a Gap Filling process. A chemical Mechanical Polishing ("CMP") operation is performed on the oxide layer to planarize the semiconductor substrate and the oxide layer in the trench. As a result, a field oxide layer is formed on the field region of the semiconductor substrate.

The oxide layer, which fills the trench generally includes an O-Tetra-Ethyl-Ortho—Silicate (TEOS) Atmospheric Pressure Chemical Vapor Deposition (APCVD) oxide layer and a High Density Plasma Chemical Vapor Deposition (HDP CVD) oxide layer. These materials have excellent properties for gap-filling and planarizing.

The conventional STI process is illustrated in FIGS. 1 to 4. An oxide layer 11, which functions as a sacrificial layer, is formed on the entire surface of one side of a semiconductor substrate 10. The substrate 10 is a silicon substrate. A nitride layer 13, which functions as a hard mask layer, is deposited on the oxide layer 11. Using photolithography, an opening 14 is formed in a portion of the oxide layer 11 and the nitride layer 13 corresponding to the field region of the semiconductor substrate 10. Using the nitride layer 13 as an etching mask layer, the semiconductor substrate 10 is then etched to form a trench 15 in the field region of the semiconductor substrate 10, as shown in FIG. 1.

Using a thermal oxidation process, an oxide layer 17 is grown on the etched face of the exposed semiconductor substrate 10 in the trench 15. An insulating layer (for example, an oxide layer 19) is deposited in the trench 15. The insulating layer 15 is deposited to a thickness to cover the nitride layer 13 and the trench 15 so that the oxide layer 17 is covered, as shown in FIG. 2.

The oxide layer 19 is planarized on the nitride layer 13 using a CMP process, so that the oxide layer 19 is left only in the trench 15, as shown in FIG. 3. The oxide layer 19 is then densified by a high temperature annealing process. The oxide layer 19 is wet-etched to a certain depth with an HF solution to reduce the height of the oxide layer 19, as shown in FIG. 4. The nitride layer 13 is then etched with a phosphoric acid solution to expose the oxide layer 11. Then, the oxide layer 11 is etched with an HF solution to expose an active region of the semiconductor substrate 10, which completes the STI process.

This prior art STI process, however, has drawbacks. In particular, divot 21 are frequently generated at an upper edge portion of the trench 15, as shown in FIG. 4. The divot 21 forms when the oxide layer 19 is etched using the nitride layer 13 as an etching mask layer so as to reduce the height of the oxide layer 19 because a boundary portion between the oxide layer 19 and the nitride layer 13 is etched faster than the other portion.

A gate oxide layer (e.g., a MOS transistor) is grown on an active region of the semiconductor substrate 10 by a thermal oxidation process. When a divot 21 is present, the gate oxide layer grown on the divot 21 is thinner than that grown on the active region of the semiconductor substrate 10. As a result, the MOS transistor may frequently malfunction whereby the MOS transistor is operated under a threshold voltage VT of the MOS transistor. The electrical properties of the semiconductor device are degraded. There is an increase in current leakage. The yield rate of semiconductor device of suitable quality is reduced. It is possible to reduce the presence of divots 21, but it is very difficult to secure sufficient margins of a wet etching to reduce a generation of the divot 21. The process is difficult, which reduces productivity.

Semiconductor devices with higher degrees of integration may also require finer trench widths. The current photolithography process used with the STI process, however, has limits which prevents the formation of finer trenches.

BRIEF SUMMARY OF THE INVENTION

It is an aspect of the present invention to provide a method of manufacturing a semiconductor device that solves the above-mentioned problems associated with the prior art manufacturing processes. It is a further aspect of the present invention to easily provide a trench having a fine width without modifying a photolithography process. The method improves the current leakage characteristics of a trench.

The present invention is directed to a method for manufacturing a semiconductor device, the method includes depositing an oxide layer on a semiconductor substrate and depositing a nitride layer on the oxide layer. An opening is formed in the oxide layer and the nitride layer exposing a field region of the semiconductor substrate. A trench is formed in the semiconductor substrate in the exposed region in the opening. The oxide layer and the nitride layer are then removed. A silicon epitaxial layer is formed with a certain thickness on the semiconductor substrate and in the trench. The silicon epitaxial layer is grown in such a manner that a portion thereof at a sidewall of the trench is thickened relative to a bottom portion of the trench. The silicon epitaxial layer can have a round profile at an upper edge portion of the trench. An insulating layer is deposited in the trench. The insulating layer is then planarized.

BRIEF DESCRIPTION OF THE DRAWINGS

The invention will be described in conjunction with the following drawings in which like reference numerals designate like elements and wherein.

DETAILED DESCRIPTION OF THE INVENTION

Hereinafter, a preferred embodiment of the present invention will be described with reference to the accompanying drawings.

A semiconductor substrate 10 is provided. The substrate 10 can be formed from a silicon substrate. An oxide layer 11 is grown on one side (i.e., the front face) of the semiconductor substrate 10. The oxide layer 11 is a sacrificial layer and can have a thickness of 40 Å to 150 Å. A nitride layer 13 is then deposited on the oxide layer 11 using a low pressure chemical vapor deposition ("CVD") process. The nitride layer 13 is a hard mask layer and can have a thickness of 600 Å to 1500 Å. The oxide layer 11 serves to relieve stress between the semiconductor substrate 10 and the nitride layer 13. The nitride layer 13 functions as an etching mask layer for forming a trench 15 and as an etching stopper layer in a subsequent chemical mechanical polishing ("CMP") process.

Figure 1:
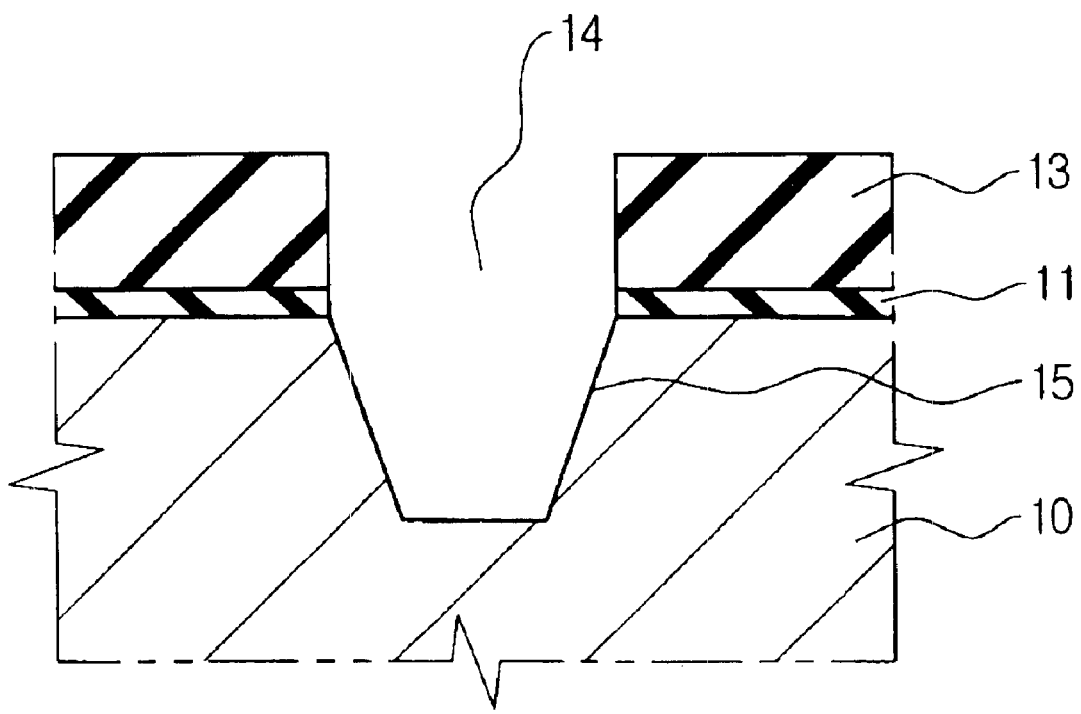
FIGS. 1 to 4 are cross-sectional views of a semiconductor device illustrating the manufacture of the same using a STI process in accordance with the prior art.
Figure 2:
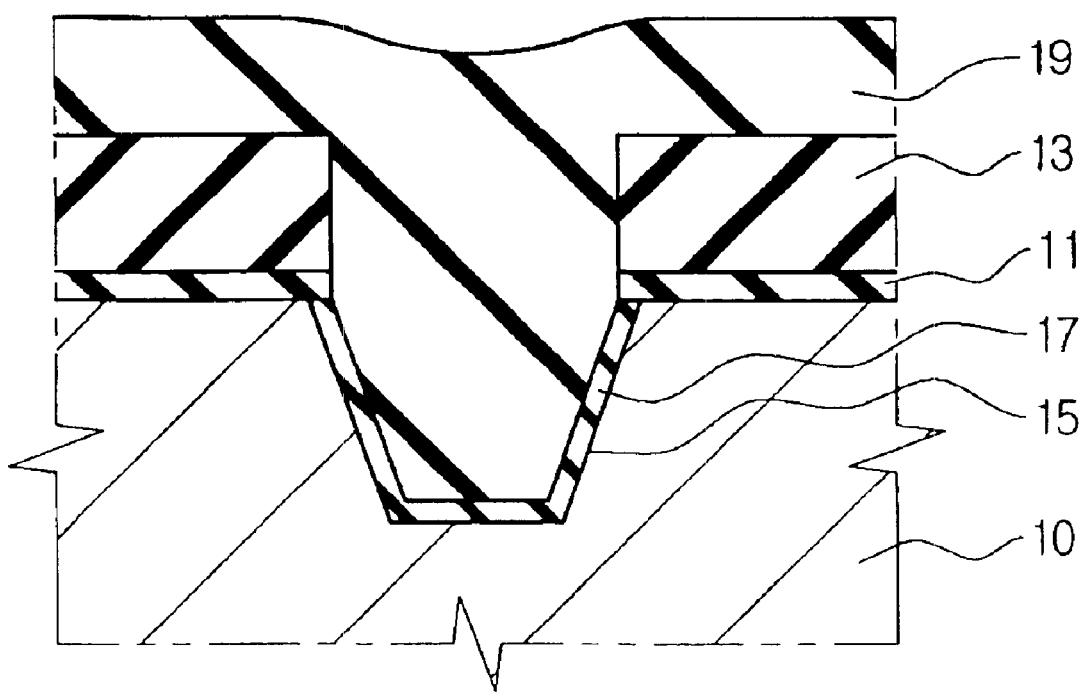
Figure 3:
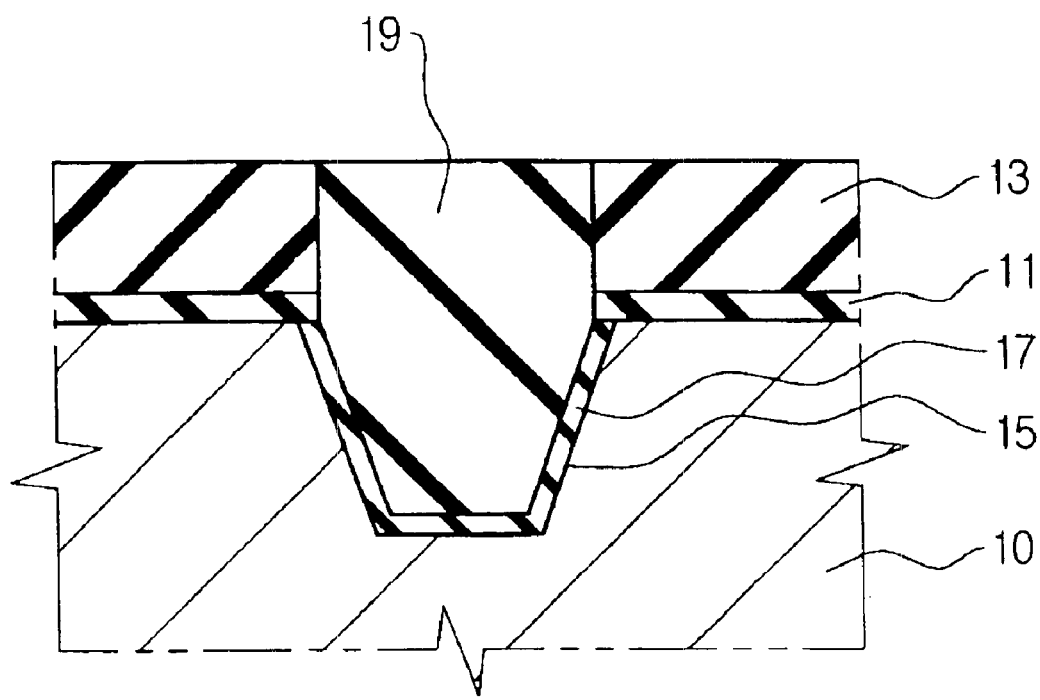
Figure 4:
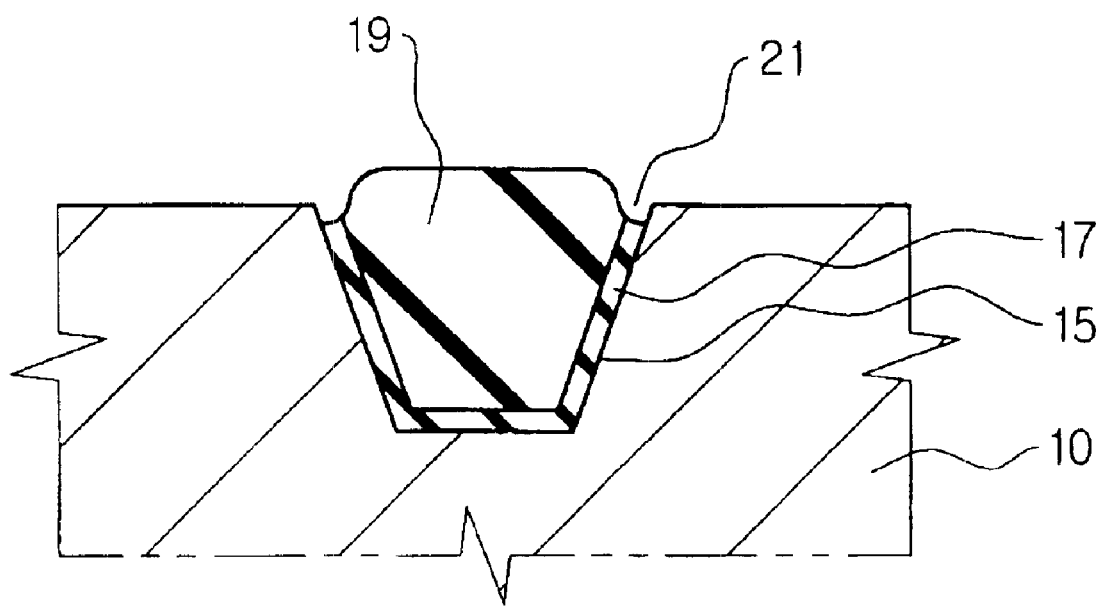
Figure 5:
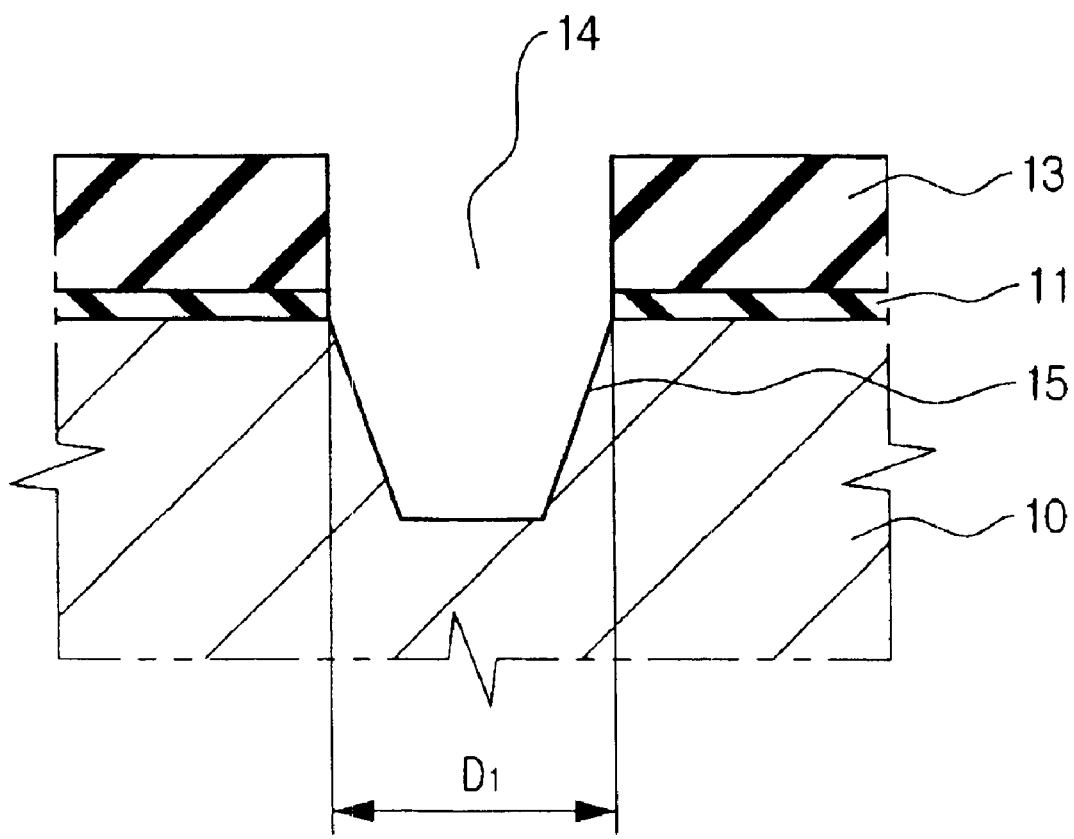
FIGS. 5 to 8 are cross-sectional views of a semiconductor device illustrating the manufacturing method in accordance with the present invention.

Using photolithography, patterns of a photoresist (not shown) are formed on the active region of the semiconductor substrate 10. The window(s) of the photoresist is positioned on a field region of the substrate 10. The patterns of the photoresist are used as an etching mask layer. The nitride layer 13 and the oxide layer 11 in the window are completely etched by an anisotropic dry etching process, which exposes the field region of the semiconductor substrate 10. The dry etching process can be a Reactive Ion Etching ("RIE"). This process forms an opening 14 in the nitride layer 13 and the oxide layer 11, as illustrated in FIG. 5. The patterns of the photoresist are removed.

The nitride layer 13 is then used as an etching mask layer. The semiconductor substrate 10 that has been exposed by the RIE process in the opening 14 is then etched to form a trench 15 in the field region of the semiconductor substrate 10, as shown in FIG. 5. The trench 15 can be formed using an RIE process of other suitable etching process to form the trench 15 with a swallow depth of approximately 3000 Å. The trench 15 has a width D1 an at upper portion. The trench 15 can have a tapered cross section, as shown in FIG. 5.

After the trench 15 has been formed, the nitride layer 13 is etched with a phosphoric acid solution and the oxide layer 11 is etched with a HF solution to expose the active region of the semiconductor substrate 10.

Figure 6:
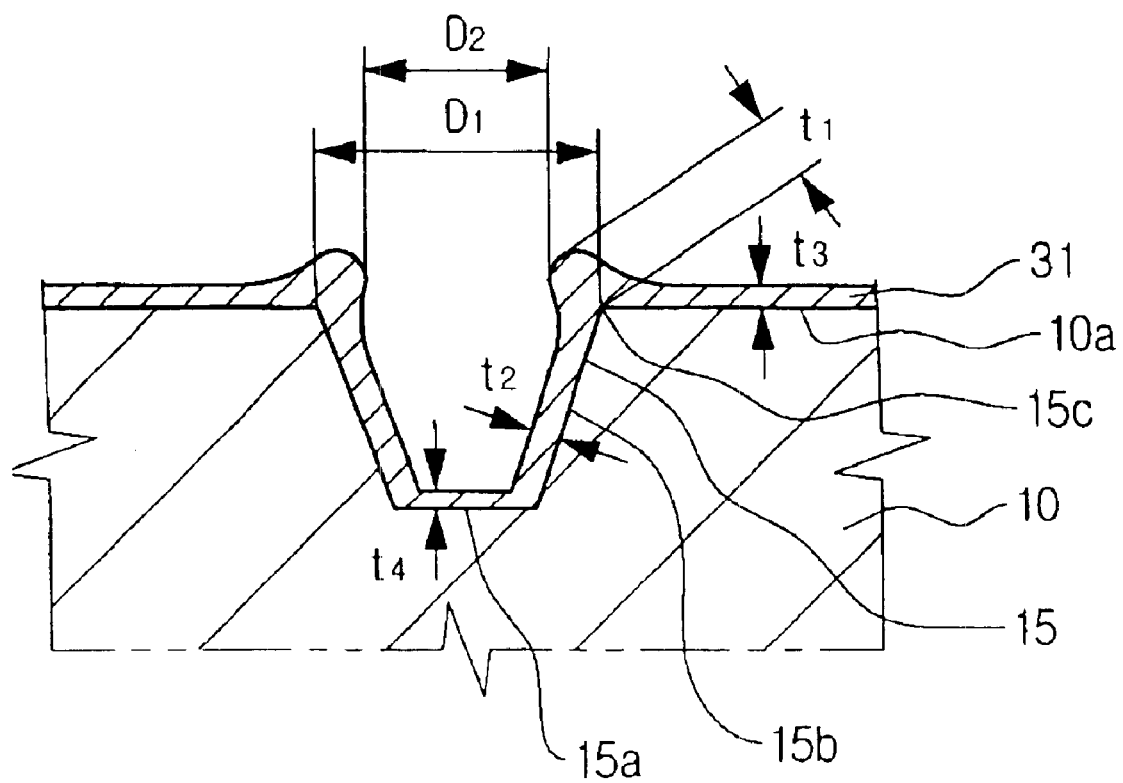

An epitaxial process is then used to grow a silicon epitaxial layer 31 on both the front face of the semiconductor substrate 10 and the trench 15, a shown in FIG. 6. The thickness of the silicon epitaxial layer 31 varies. The layer 31 has first thickness t1 at an upper edge portion 15c. The thickness of the layer 31 is greatest in the region of the upper edge portion 15c, as shown in FIG. 6. The trench 15 has a dimension D2 in the area of the opening of the trench 15. The layer 31 has a second thickness t2 at a sidewall portion 15b, which is smaller than the first thickness t1. The layer 31 has a third thickness t3 on a surface 10a of the active region of the substrate 10, which is smaller than the second thickness t2. The layer 31 has a fourth thickness t4 at a bottom portion 15a of the trench 15. The thickness of the layer 31 is the thinnest at the bottom portion 15a when compared to the other portions of the layer 31, as illustrated in FIG. 6. The growth rate of the silicon epitaxial layer 31 is determined by the number of the dangling bonds on the exposed surface of the semiconductor substrate 10. The number of dangling bonds is proportional to the number of atoms per unit area. The number of silicon atoms at the sidewall 15b is greater than the number of silicon atoms at a plane (100) on the bottom face 15a of the trench 15. The growth rate of the silicon epitaxial layer 31 is greatest along the upper edge portion 15c of the trench 15, then the sidewall 15b of the trench 15, then the surface 10a of the active region, and finally along the bottom face 15a of the trench 15. As a result, the thickness of the silicon epitaxial layer 31 at the sidewall 15b is greater relative to the bottom face 15a of the trench 15. Accordingly, a trench with a finer width can be formed while using conventional photolithography. Since the number of dangling bonds is greater at the upper edge portion 15c of the trench 15 than along the lower edge portion of the trench 15, the upper edge portion 15c can be formed with a round cross section, as shown in FIG. 6. This construction is effective to restrict leakage current along the upper edge portion of the trench 15.

Figure 7:
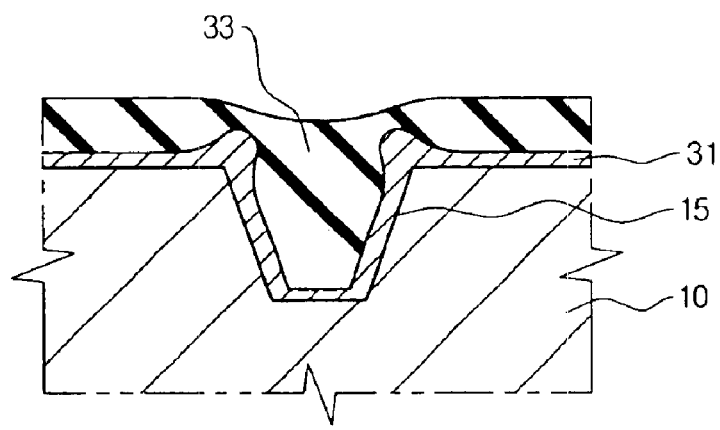

An insulating layer 33 is deposited in the trench 15, as shown in FIG. 7. Preferably, voids are not generated in the insulating layer 33 in the trench 15.

The insulating layer 33 can be formed by an O-Tetra-Ortho-Silicate-Glass (TEOS) Atmospheric Pressure CVD, or Plasma Enhanced CVD (PECVD), or High Density Plasma CVD (HDP CVD).

Figure 8:
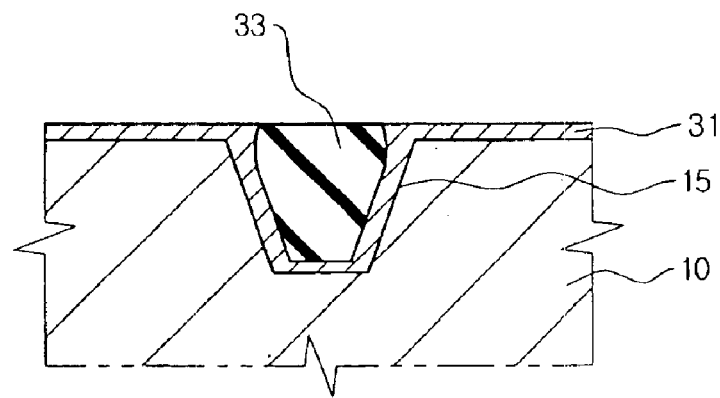

The oxide layer 33 is planarized on the silicon epitaxial layer 31 by a CMP process. Preferably, the insulating layer 33 exists in only the trench 15 and it does not exist on the silicon epitaxial layer 31 outside the trench 15, as shown in FIG. 8. The presence of the increased thickness portions of the epitaxial layer 31 in the area of 15c shown in FIGS. 6 and 7 limits the formation of divots.

According to the present invention, the trench 15 is formed on the field region of the semiconductor substrate 10, the silicon epitaxial layer 31 is grown on the active region 10a of the semiconductor substrate 10, the bottom face 15a and the sidewall 15b of the trench 15, and then the insulating layer 33 is deposited in the trench 15.

Thus, since the silicon epitaxial layer 31 is thickened at the sidewall 15b relative to the bottom face 15a, the present invention can manufacture a trench 15 with finer width, as shown in FIG. 8 while using conventional photolithography. Also, the silicon epitaxial layer 31 at upper edge portion 15c of the trench 15 can be formed with a curved cross section. This geometry prevents an increase of current leakage because of a lack of divots at the upper edge portion 15c of the trench 15, and therefore improving the electric property of a semiconductor device.

As described before in detail, in the manufacturing method of the semiconductor device of the present invention, the oxide layer 11 and the nitride layer 13 are successively formed on the semiconductor substrate 10, the opening 14 of the oxide layer 11 and nitride layer 13 is formed on the field region of the semiconductor substrate 10, the trench 15 is formed by etching the field region of the semiconductor substrate 10, as shown in FIG. 5, the oxide layer 11 and the nitride layer 13 are removed, the silicon epitaxial layer 31 is grown on the semiconductor substrate 10 and in the trench 15, and finally the oxide layer 31 is buried in the trench 15, as shown in FIG. 8.

Since the silicon epitaxial layer 31 has greater thickness at the sidewall 15b relative to the bottom face 15a, the trench 15 with having a finer width, as shown in FIG. 8, is formed even while using conventional photolithography process. Also, the silicon epitaxial layer 31 at upper edge portion 15c of the trench 15 can be formed round increased cross section, which restricts an increase of current leakage due to a lack of divots at the upper edge portion 15c of the trench 15, and therefore improving the electrical properties of a semiconductor device.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device, comprising:

depositing an oxide layer on a semiconductor substrate;

depositing a nitride layer on the oxide layer;

forming an opening in the oxide layer and the nitride layer exposing a field region of the semiconductor substrate;

forming a trench in the semiconductor substrate in the exposed region in the opening;

removing the oxide layer and the nitride layer;

forming a silicon epitaxial layer having a predetermined thickness pattern on the semiconductor substrate and the trench;

depositing an insulating layer in the trench; and planarizing the insulating layer.

2. The method for manufacturing a semiconductor device as claimed in claim 1, wherein the silicon epitaxial layer is formed in such a manner that a portion thereof at a sidewall of the trench has a thickness greater than a thickness of the silicon expitaxial layer at a bottom portion of the trench.

3. The method for manufacturing a semiconductor device as claimed in claim 2, wherein the silicon epitaxial layer has a thickness at an upper edge portion of the trench that is greater than the thickness of the silicon epitaxial layer at the sidewall of the trench.

4. The method according to claim 3, wherein the silicon epitaxial layer has a curved cross section at the upper edge of the trench.

5. The method for manufacturing a semiconductor device as claimed in claim 1, wherein the silicon epitaxial layer has an increased thickness is at an upper edge portion of the trench.

6. The method according to claim 5, wherein the silicon epitaxial layer has a curved cross section at the upper edge of the trench.

7. The method for manufacturing a semiconductor device as claimed in claim 1, wherein the insulating layer is formed by one of an O-Tetra-Ortho-Silicate-Glass Atmospheric Pressure CVD process, Plasma Enhanced CVD process, and High Density Plasma CVD process.

8. The method for manufacturing a semiconductor device as claimed in claim 1, wherein the nitride layer is etched with a phosphoric acid solution.

9. The method for manufacturing a semiconductor device as claimed in claim 1, wherein the oxide layer is etched with a HF solution.

10. The method for manufacturing a semiconductor device as claimed in claim 1, wherein the insulating layer is planarized by Chemical Mechanical Polishing.

11. The method for manufacturing a semiconductor device as claimed in claim 10, wherein the insulating layer exists in only the trench after being planarized.

* * * * *